(12) United States Patent
Chang et al.

(10) Patent No.: US 7,220,971 B1
(45) Date of Patent: May 22, 2007

(54) MULTI-PIXEL ELECTRON MICROBEAM IRRADIATOR SYSTEMS AND METHODS FOR SELECTIVELY IRRADIATING PREDETERMINED LOCATIONS

(75) Inventors: Sha X. Chang, Chapel Hill, NC (US); Otto Z. Zhou, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 0 days.

(21) Appl. No.: 11/320,515

(22) Filed: Dec. 28, 2005

Related U.S. Application Data

(60) Provisional application No. 60/639,958, filed on Dec. 29, 2004.

(51) Int. Cl.
*G01K 1/08* (2006.01)
(52) U.S. Cl. .................................................. 250/398
(58) Field of Classification Search ................ 378/122; 250/398
See application file for complete search history.

(56) References Cited

U.S. PATENT DOCUMENTS

| | | | |
|---|---|---|---|
| 6,277,318 B1 | 8/2001 | Bower et al. | |
| 6,545,396 B1 * | 4/2003 | Ohki et al. | 313/309 |
| 6,553,096 B1 | 4/2003 | Zhou et al. | |
| 6,630,772 B1 | 10/2003 | Bower et al. | |
| 6,850,595 B2 | 2/2005 | Zhou et al. | |
| 6,876,724 B2 | 4/2005 | Zhou et al. | |
| 2003/0102222 A1 | 6/2003 | Zhou et al. | |

OTHER PUBLICATIONS

Resat et al., "Microbeam developments and applications: A low linear energy transfer perspective," Cancer and Metastasis Reviews 23: p. 323-331 (2004).
International Search Report for corresponding International Application No. PCT/US05/47066 dated Oct. 6, 2006.

* cited by examiner

*Primary Examiner*—David Vanore
(74) *Attorney, Agent, or Firm*—Jenkins, Wilson, Taylor & Hunt, P.A.

(57) ABSTRACT

Multi-pixel electron microbeam irradiator systems and methods are provided with particular applicability for selectively irradiating predetermined cells or cell locations. A multi-pixel electron microbeam irradiator system can include a plurality of individually addressable electron field emitters sealed in a vacuum. The multi-pixel electron microbeam irradiator system can include an anode comprising one or more electron permeable portions corresponding to the plurality of electron field emitters. Further, the multi-pixel electron microbeam irradiator system can include a controller operable to individually control electron extraction from each of the electron field emitters for selectively irradiating predetermined locations such as cells or cell locations.

57 Claims, 7 Drawing Sheets

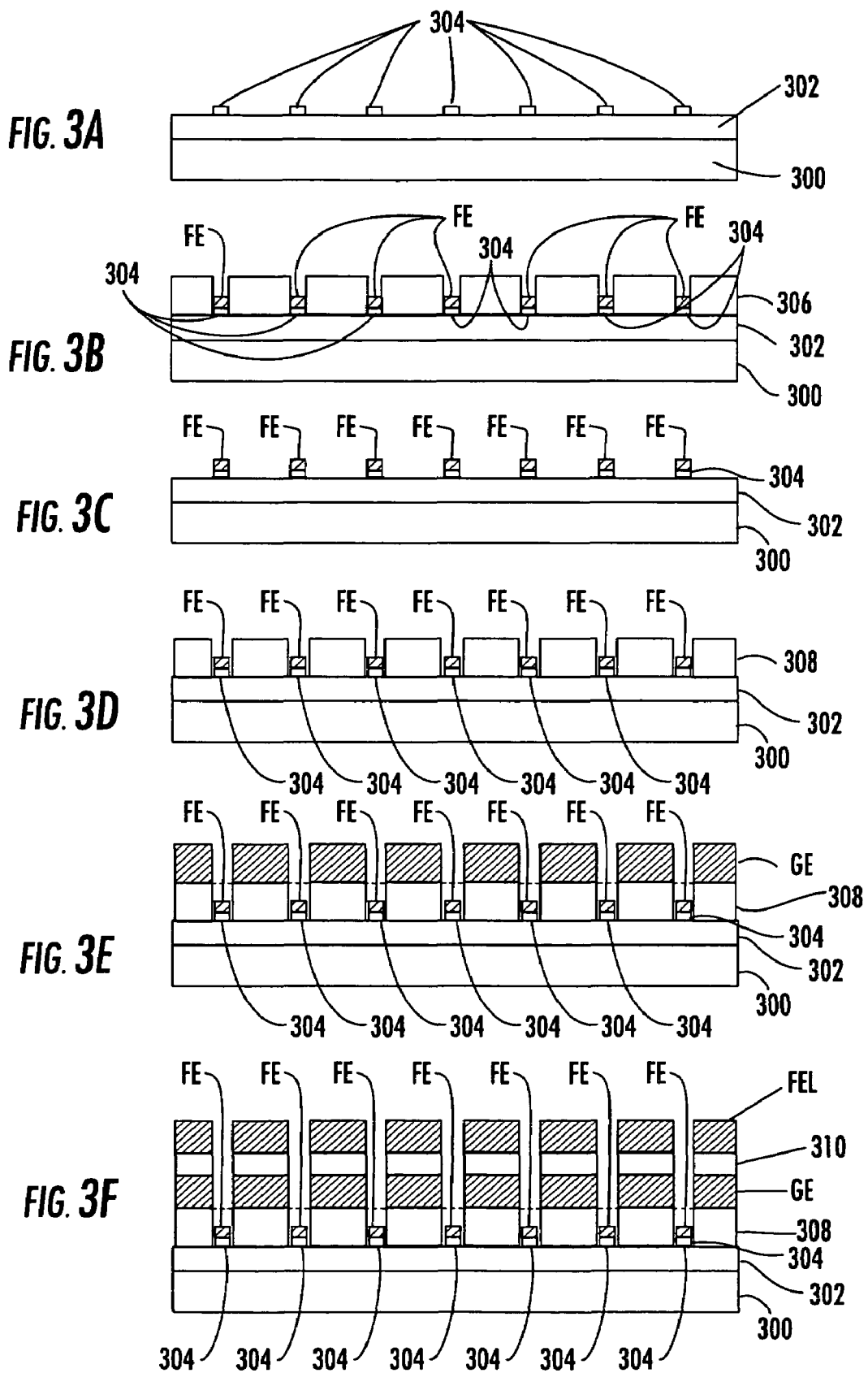

MULTI-PIXEL ELECTRON MICROBEAM IRRADIATOR SYSTEMS AND METHODS FOR SELECTIVELY IRRADIATING PREDETERMINED LOCATIONS

CROSS-REFERENCE TO RELATED APPLICATION

This non-provisional patent application claims the benefit of U.S. Provisional Application No. 60/639,958, filed Dec. 29, 2004, the disclosure of which is incorporated by reference herein in its entirety.

TECHNICAL FIELD

The subject matter disclosed herein relates to electron irradiation devices and methods using electron field emission technology. More particularly, the subject matter disclosed herein relates to multi-pixel cell irradiator systems and methods for selectively irradiating cells at predetermined locations.

BACKGROUND ART

Microbeam irradiators can be utilized for studying the microscopic biological effects of radiation in the cellular and sub-cellular level. Such devices can be utilized to bombard one or more cells with charged particles or photons for predetermined radiation dose and dose rate. An understanding of radiobiology at the cellular and sub-cellular level is important for improvements of cancer treatment and for an understanding of low dose radiation risk. Cellular microradiation is recognized as a powerful technique for this endeavor. One of the most active areas of research using a microbeam irradiator is the "bystander effect", which involves the response of "unhit" cells to the radiation deposited in their neighboring cells. "Bystander effect" studies using microbeam devices have revealed the complicated intra-cellular and inter-cellular response to radiation that may have significant impact on the policy making of radiation protection for general public and for the space program.

Cell irradiation can include exposing cells to alpha particles, electrons, or X-rays. Recently, there has been interest in low-linear energy transfer (LET) microbeams using electrons and ultrasoft X-rays. Thermionic emission and field emission are two mechanisms for generating electrons. Although field emission is a sometimes preferred mechanism to extract electrons, many currently available vacuum electronic devices utilize thermionic electron sources. The wide use of thermionic electron sources may be partly due to the lack of effective electron field emitters. Recent studies have shown that carbon nanotubes have promising electron emission properties with high emission current, low turn-on field, and lifetime that can be required for device applications. A typical field emission device can include a cathode having a plurality of electron field emitters (e.g., carbon nanotubes) and an anode spaced from the cathode. A voltage applied between the anode and the cathode can induce the emission of electrons from the electron field emitters towards the anode.

A few large research institutions in the world are capable of delivering microbeam irradiation at the cellular level. These microbeam devices require major resources to develop and maintain. Further, in currently available microbeam irradiators, there is only a single microbeam port. One exemplary single port electron microbeam having a thermionic electron source includes an electron gun consisting of a heated filament and electron optics for accelerating and collimating a broad electron beam. The electron optics includes a suppression aperture that allows pulsing of the beam with sub-microsecond time resolution. The final spatial resolution of an electron microbeam can be achieved either by focusing or collimation. The electron microbeam can be used to target individual cells without significant scattering to neighboring cells. Target cells or sub-cellular regions designated for irradiation in a population must be irradiated one at a time by physically aligning the microbeam with each of the target cells. Some research experiments require the irradiation of a large number of individually selected cells, as many as 10,000, to obtain statistically significant results. This requirement makes it difficult to utilize single port microbeam devices for experiments requiring irradiation of a large number of cells and, especially, if real-time observation is also required.

Most cell irradiations in research labs today use irradiators that cannot deliver radiation beams much smaller than a centimeter. Therefore, researchers often have to deduce conclusions about microscale activities of a cell from macroscopic studies of irradiating a group of cells. The lack of microscale radiation manipulation ability can be especially detrimental when studying a minority cell type in a large cell population because of the low signal to noise ratio in the experimental data.

Accordingly, in light of desired improvements associated with microbeam cellular irradiators, there exists a need for improved microbeam irradiator functionality and availability and related methods.

SUMMARY

In accordance with this disclosure, novel multi-pixel electron microbeam irradiator systems and methods for selectively irradiating predetermined locations are provided.

It is an object of the present disclosure therefore to provide novel microbeam irradiator systems and methods for selectively irradiating predetermined locations. This and other objects as may become apparent from the present disclosure are achieved, at least in whole or in part, by the subject matter described herein.

BRIEF DESCRIPTION OF THE DRAWINGS

Preferred embodiments of the subject matter described herein will now be described with reference to the accompanying drawings, of which:

FIGS. 3A–3F are steps of a method for fabricating multiple electron field emitters, a gate electrode, and a focusing electrode according to one embodiment of the subject matter described herein;

DETAILED DESCRIPTION

Figure 1A:
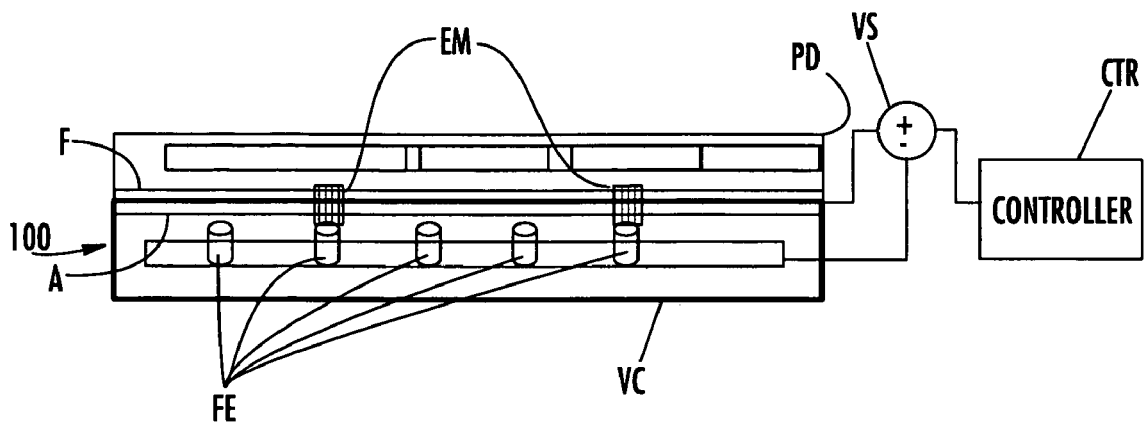
FIG. 1A is a schematic, cross-sectional side view of a multi-pixel electron microbeam irradiator system and a Petri dish in a cell irradiation setup according to one embodiment of the subject matter described herein.

In accordance with the present disclosure, multi-pixel, electron microbeam irradiator systems and methods are provided. The systems and methods described herein can have particular application for use in selectively irradiating predetermined locations such as cells or cellular locations as described herein. An electron microbeam irradiator system according to the present disclosure can include a plurality of individually addressable electron field emitters sealed in a vacuum. Further, an electron microbeam irradiator system can include an anode comprising one or more electron permeable portions corresponding to the plurality of electron field emitters. A controller can be operable to individually control electron extraction from each of the electron field emitters for selectively irradiating predetermined locations. The electron emitters can be individually turned on and off for individually irradiating the predetermined locations for a predetermined time duration and radiation dosage using a predetermined sequence.

The electron field emitters can be any suitable conductive structure and can have a sharp tip or protrusion for electron emission under an electrical field. Exemplary electron field emitters can include "Spindt" tips and other suitable nanostructures. "Spindt" tips and related processes are described in the publication "Vacuum Microelectronics," I. Brodie and C. A. Spindt, *Advances in Electronics and Electron Physics*, 83: 1–106 (1992), the disclosure of which is incorporated by reference herein. Exemplary materials of electron field emitter tips can include molybdenum (Mo), silicon (Si), diamond (e.g., defective CVD diamond, amorphic diamond, cesium-coated diamond, a nano-diamond), and graphite powders.

Nanostructures suitable for electron emission can include nanotube and nanowires/nanorods composed of either single or multiple elements, such as carbon nanotubes. A single carbon nanotube can have a diameter in the range of about 0.5–500 nm and a length on the order of about 0.1–100 microns.

Carbon nanotubes readily emit large fluxes of electrons with small angular divergence. A carbon nanotube can include a single graphene shell, which is termed a single-wall carbon nanotube, or multiple concentric graphene shells, which is termed a multi-wall carbon nanotube. Carbon nanotubes, nanowires and nanorods can be fabricated by techniques such as laser ablation, arc discharge, and chemical vapor deposition (CVD) methods. Further, carbon nanotubes can be made via solution or electrochemical synthesis. An exemplary process for fabricating carbon nanotubes is described in the publication "Materials Science of Carbon Nanotubes: Fabrication, Integration, and Properties of Macroscopic Structures of Carbon Nanotubes," Zhou et al., *Acc. Chem. Res.*, 35: 1045–1053 (2002), the disclosure of which is incorporated herein by reference. A single carbon nanotube or a nanotube bundle can produce a current of about 0.1–10 µA.

Table 1 below summarizes the threshold field required to obtain a current density of 10 mA/cm$^2$ for several electron field emitter/cathode materials.

TABLE 1

Emission Threshold Field of Different Field Emitter/Cathode Material

| Electron Field Emitter/Cathode Material | Threshold Field (V/µm) for 10 mA/cm$^2$ |
|---|---|
| Mo Tips | 50–100 |
| Si Tips | 50–100 |
| p-type Diamond | 160 |
| Defective CVD Diamond | 30–120 |
| Amorphic Diamond | 20–40 |
| Cesium-coated Diamond | 20–30 |
| Graphite Powders | 10–20 |
| Nano-Diamond | 3–5 (unstable > 30 mA/cm$^2$) |
| Assorted Carbon Nanotubes | 1–2 (stable > 4000 mA/cm$^2$) |

In one embodiment, a multi-pixel electron microbeam irradiator system in accordance with the subject matter disclosed herein can include electron field emitters for irradiation of an area, such as, for example, 10$^3$–10$^6$ (per square centimeter of area) individually selected cells or sub-cellular regions in a Petri dish. This radiation can be simultaneous, sequential, or of any predetermined temporal pattern. The radiation to each selected region can be controlled (i.e., individually turned on or off). The radiation can be controlled with high spatial (micrometer scale) and/or temporal (microsecond scale) resolution. Further, the radiation dose rate can be controlled and it can produce low to ultra-high dose rate (about 10$^3$ Gy/sec$^3$). The physical size of a multi-pixel electron microbeam irradiator system according to the present disclosure can be small and portable. It is envisioned that the device can be placed directly under an optical microscope for in-situ observation during the irradiation process.

Figure 1B:
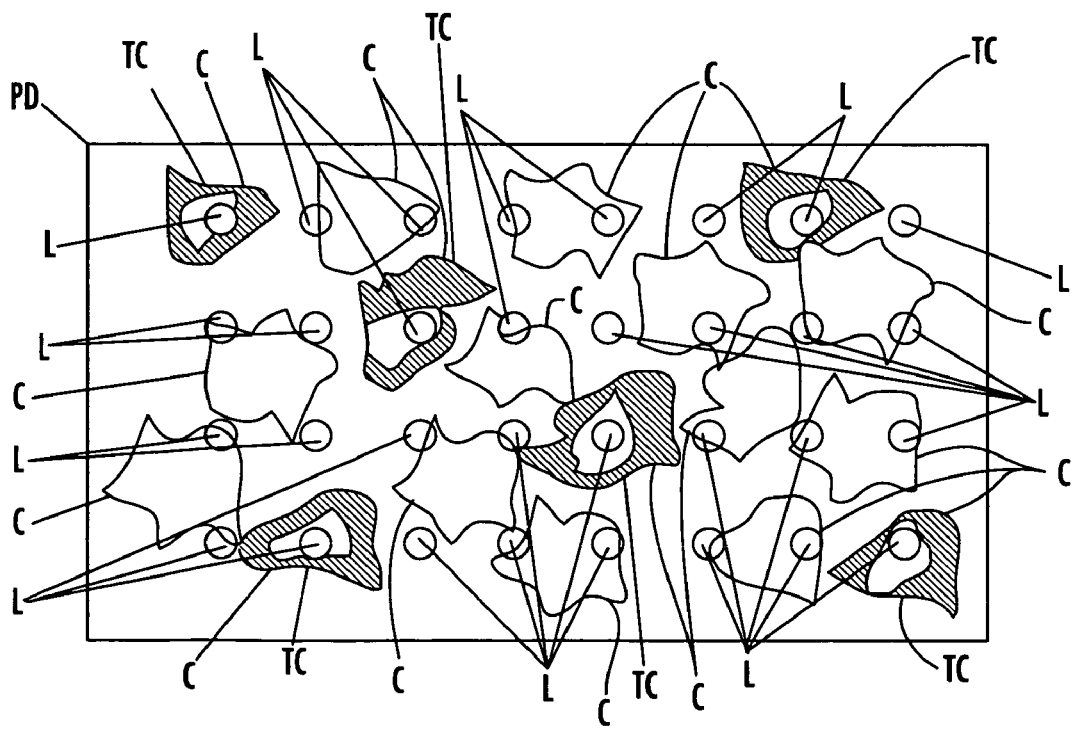
FIG. 1B is a schematic top view of predetermined locations that can be individually irradiated by the electron field emitters of the multi-pixel electron microbeam irradiator system shown in FIG. 1A in accordance with one embodiment of the subject matter described herein.

FIGS. 1A and 1B illustrate views of a multi-pixel electron microbeam irradiator system having a plurality of locations that can be selectively irradiated by the multi-pixel electron microbeam irradiator system according to one embodiment of the subject matter described herein. FIG. 1A is a schematic, cross-sectional side view of a multi-pixel electron microbeam irradiator system generally designated 100 and a Petri dish PD in a cellular irradiation setup. System 100 can include a plurality of individually addressable and controllable electron field emitters FE (also referred to herein as "pixels") for selectively irradiating predetermined locations L in Petri dish PD. FIG. 1B is a schematic top view showing predetermined locations L that can be individually and selectively irradiated by electron field emitters FE of system 100. Referring now to FIG. 1A, each electron field emitter FE can comprise one or more carbon nanotubes and/or other suitable electron field emission materials. Electron field emitters FE can be attached to a surface of a cathode, conductive or contact line, or other suitable conductive material. The cathodes can be attached to a suitable non-conductive substrate such that the electron field emitters are electrically isolated.

Electron field emitters FE can be individually controlled (i.e., turned on and off) to emit electrons for selectively irradiating predetermined locations L (shown in FIG. 1B). In one embodiment, a controller CTR can control a voltage source VS to individually apply voltages between each electron field emitter FE and a gate electrode (not shown) to generate electric fields for extracting electrons from electron field emitters FE. Controller CTR can include hardware, software, and/or firmware, such as memory (e.g., RAM, ROM, and computer-readable disks), transistors, capacitors, resistors, inductors, logic circuitry, and other components suitable for individually controlling electron emission from electron field emitters FE. Controller CTR can also control the intensity, timing, and duration of electron emission for each of the electron field emitters FE.

Controller CTR can execute instructions for performing a sequence by which locations L are irradiated with electron beams generated by electron field emitter FE. The executable instructions can be implemented as a computer program product embodied in a computer readable medium. Exemplary computer readable media can include disk memory devices, chip memory devices, application specific integrated circuits, programmable logic devices, downloadable electrical signals, and/or any other suitable computer readable media.

Electron field emitters FE can be oriented such that extracted electrons are directed towards respective predetermined locations L. Further, a voltage can be applied between the gate electrode and an anode A for accelerating the extracted electrodes towards anode A. The voltage for accelerating the extracted electrodes can be between about 20–60 kV and adjusted such that electrons reach a desired energy for delivering radiation to predetermined locations L. The energy of a beam of electrons at anode A can be about 10 KV or greater. System 100 can also include a collimator and/or focusing electrode for collimating and focusing electrons extracted from electron field emitters FE and thus reducing the size of electron microbeams EM.

A vacuum chamber VC can include a sealed interior for containing electron field emitters FE and the gate electrode. The interior of vacuum chamber VC can be evacuated to achieve a desired interior pressure. An exemplary interior pressure of vacuum chamber VC can be about 10–7 Torr. Predetermined locations L can be positioned on an exterior of vacuum chamber VC. Extracted electrons can travel from the interior of vacuum chamber VC to its exterior through electron permeable portions, such as one or more thin $Si_4N_3$ or polymer exit windows. The electron permeable portions can be made of any suitable material having sufficient thickness for permitting electrons to pass and having sufficient robustness for withstanding a pressure difference between the interior and exterior of vacuum chamber VC.

In one embodiment, Petri dish PD can be positioned to receive electron microbeams EM emitted from microbeam irradiator system 100. Petri dish PD can include a bottom component comprising a polyester film such as a Mylar® brand film F for allowing minimal attenuation of electron microbeams EM before the beams reach locations L. Referring now to FIG. 1B, Petri dish PD can include a monolayer of cells C that can be selectively irradiated by system 100 (shown in FIG. 1A). In one embodiment, a reflective microscope (not shown) can be used to image the cell population and identify the target cells or regions and their locations, as well as for real-time observation of cells C during and after radiation. Using available cellular imaging and image analysis packages, an operator can quickly identify target cells TC for irradiation. Automated cellular microscope image analysis software as utilized are understood by those of skill in the art.

In one exemplary process for irradiating target cells TC using microbeam irradiator system 100, all of electron field emitters FE can be turned on for identifying all positions P that can be irradiated by system 100. The position identification process can occur without Petri dish PD in position to receive radiation. Next, while all of electron field emitters FE are turned on, an image capture device having control and imaging equipment suitable for capturing microscopic images and relative positions can be used to capture an image of the positions irradiated by the emitted electrons. Next, the imaging equipment can determine the relative coordinates of the positions. When system 100 is placed in a position for irradiating cells C in dish PD, two or more "calibration" electron field emitters FE can be turned on and imaged in the same coordinate system where target cells TC are identified.

Subsequent to a determination of the coordinates of the "calibration" electron field emitters FE, the coordinates of other "non-calibration" electron field emitters FE can be determined. Next, electron field emitters FE can be selected that correspond to locations of respective target cells TC. The electron field emitters FE corresponding to respective target cells TC can be activated and controlled to deliver a predetermined radiation dosage to target cells TC. Controller CTR can be programmed to control the intensity, timing, and duration of electron emission by electron field emitters FE to target cells TC. Further, one or more images of the cells in dish PD can be captured during and subsequent to exposure for obtaining information for radiation biology research.

Figure 2:
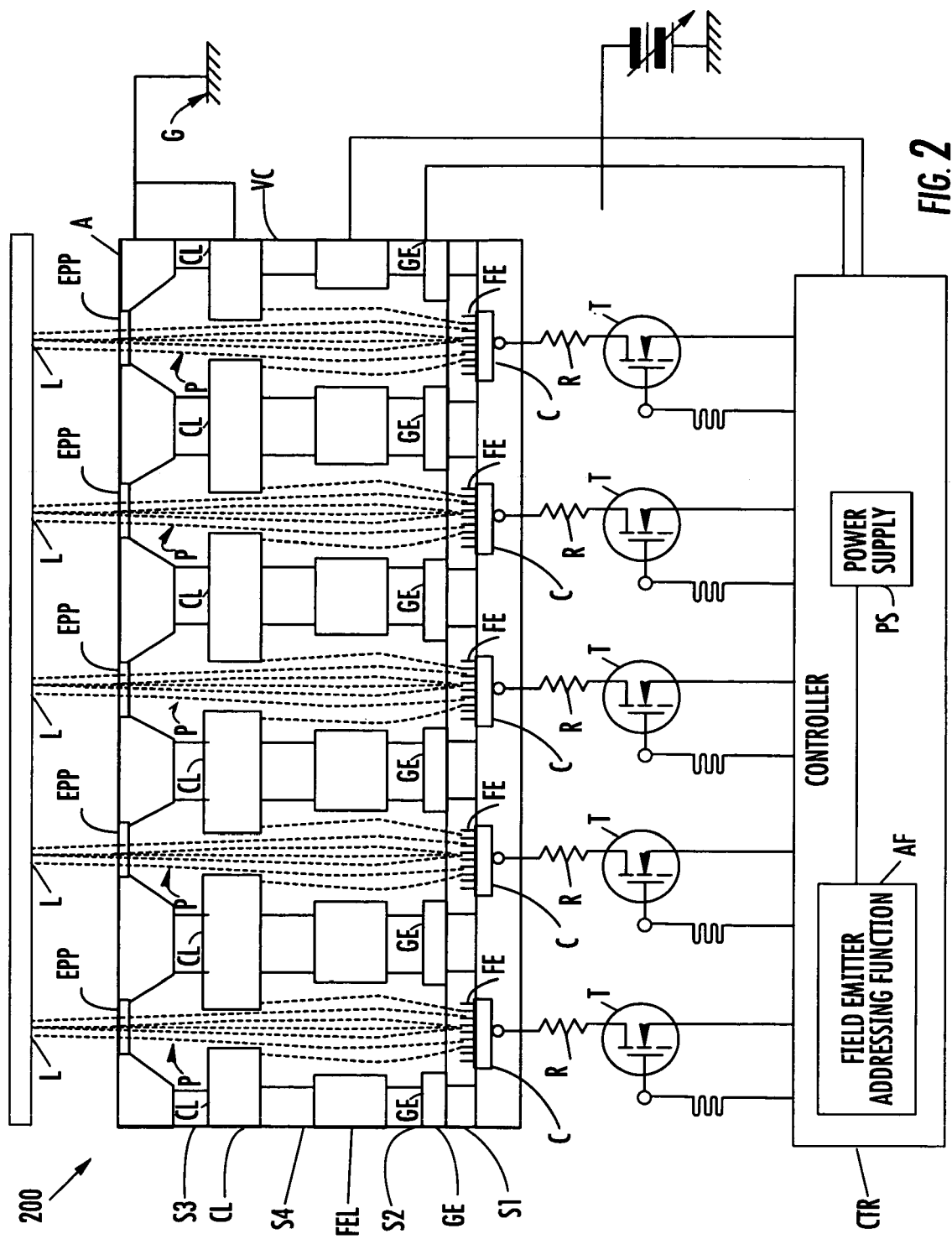
FIG. 2 is a schematic, cross-sectional side view of another multi-pixel electron microbeam irradiator system including a plurality of individually addressable electron field emitters for selectively irradiating predetermined locations according to one embodiment of the subject matter described herein.

FIG. 2 illustrates a schematic, cross-sectional side view of a multi-pixel electron microbeam irradiator system 200 including a plurality of individually addressable electron field emitters FE for selectively irradiating predetermined locations L according to one embodiment of the subject matter described herein. Referring to FIG. 2, system 200 can include a gate electrode GE operable to extract electrons from field emitters FE on generation of an electric field between gate electrode GE and field emitters FE. After extraction from field emitters FE, the electrons can be formed as electron microbeams and directed by generated electrical fields to travel along pathways P. Field emitters FE may be spaced apart in an array or grid such that different locations may be irradiated by the emitted electrons. A controller CTR may be operable to individually control electron emission from each field emitter FE for selectively irradiating locations L along pathways P.

In one embodiment, controller CTR can individually operate a plurality of metal-oxide-semiconductor field-effect transistors (MOSFETs) T for individually addressing field emitters FE to emit electrons. In one embodiment, controller CTR can be a digital I/O board. Controller CTR can include a field emitter addressing function AF that can individually switch on and off transistors T. The drains of field emitters FE can be connected to a corresponding one of a plurality cathodes C. Each cathode C can be connected to a respective field emitter FE via a resistor such as a 100 kilo ohm protection resistor R. Function AF can control power supply PS to individually turn on and off power to the sources of transistors T for individually turning transistors T on and off. Transistors T can be turned on and off by the individual application of a high signal (e.g., 5 V) and a low signal (e.g., 0 V), respectively, to the gates of the transistors T. When a high signal is applied to the gate of a transistor, a drain-to-source channel of the transistor is turned on to apply a voltage difference between a respective cathode C and gate electrode GE. A voltage difference exceeding a threshold can generate an electric field between cathode C and gate electrode GE such that electrons are extracted from respective electron field emitters FE. Conversely, when a low voltage (e.g. 0 V) is applied to the gate of a transistor, a corresponding drain-to-source channel is turned off such that the voltage at electron field emitter FE is electrically floating and the voltage difference between a respective cathode C and gate electrode GE cannot generate an electric field of sufficient strength to extract electrons from the respective electron field emitter. Function F is operable to individually control the voltages applied to the gates of transistors T. Thus, function F can individually address and control the extraction of electrons from field emitters FE.

Cathodes C can be attached to a substrate S in an array or grid-like spacing. Substrate S can be made of silicon or any other suitable non-conductive substrate material for electrically isolating cathodes C. A spacer S1 can be disposed between substrate S and gate electrode G for suitably spacing electron field emitters FE and gate electrode G. Spacer S1 can be made of an insulation material for electrically insulating substrate S and gate electrode GE.

A vacuum chamber VC can include a sealed and evacuated interior between anode A and electron field emitters FE. The interior of vacuum chamber VC can have a pressure differential with its exterior.

Further, microbeam array system 200 can include an anode A having a plurality of electron permeable portions EPP through which emitted electrons can pass. Each electron permeable portion EPP can be positioned for passing electrons from a respective electron field emitter FE. Further, electron permeable portions EPP can be made of silicon nitride ($Si_3N_4$) or any other suitable material that is permeable to electrons. Silicon nitride has a high permeability to electrons and is mechanically robust for supporting a pressure differential of the interior and exterior of vacuum chamber VC, which can be one or more atmospheres.

An voltage difference can be applied between anode A and gate electrode GE such that respective fields are generated for accelerating elections emitted by respective electron field emitters FE towards respective electron permeable portions EPP. In one embodiment, anode A and electron permeable portions EPP can be electrically connected to a ground G. Further, the energy of the electrons can be adjusted by adjusting the electrical field applied between gate electrode GE and cathode C. The voltage between gate electrode GE and cathode C can be adjusted to change the electrical field generated therebetween.

Microbeam array system 200 can include a plurality of focusing electrodes FEL for at least partially focusing electrons emitted by respective electron field emitters FE. The electrons can be focused in a direction substantially towards respective locations L. A focusing electron voltage ($V_f$) can be applied to focusing electrode FEL by power supply PS. Focusing electrode FEL can be made of any suitable conductive material, such as Al, Fe, Cu, and Mo. Focusing electrode FEL can be spaced from gate electrode GE by a spacer S2 made of a suitable material for electrically isolating focusing electrode FEL and gate electrode GE.

A plurality of collimators CL can be positioned between respective electron permeable portions EPP and electron field emitters FE. Collimators CL can collimate and tune the beam profile of the emitted electrons before the electrons pass through electron permeable portions EPP. Collimators CL can be electrically isolated from electron permeable portions EPP and anode A by a spacer S3 made of insulation material. Further, collimators CL can be spaced from focusing electrode FEL by a spacer S4 made of insulation material.

Collimators CL, focusing electrodes FEL, and gate electrodes GE can be each formed of a single layer of conductive material. For example, collimators CL can be formed of a single layer of metal. Further, collimators CL, focusing electrodes FEL, and gate electrodes GE can each include apertures for providing a pathway for emitted electrons to travel from respective electron field emitters FE.

Gate electrodes, focusing electrodes, collimators, anodes having electron permeable portions, spacers and other components of the multi-pixel electron microbeam irradiator systems described herein can be fabricated by either bulk or surface micromachining techniques. Bulk micromachining generally involves sculpting one or more sides of a substrate to form desired three dimensional structures in the same substrate material. The substrate can be made of a material that is readily available in bulk form, such as silicon or glass. Wet and/or dry etching techniques can be employed in association with etch masks and etch stops to form microstructures and apertures within the material. Etching can be performed through the backside of the substrate. The etching technique can be either isotropic or anisotropic in nature. Etch masks and etch stops are used to prevent predetermined regions of the substrate from being etched.

Conventional lithographic techniques can be employed in accordance with micromachining of the gate electrodes, focusing electrodes, collimators, anodes having electron permeable portions, spacers and other components of the multi-pixel electron microbeam irradiator systems described herein. Accordingly, basic lithographic process steps such as photoresist application, optical exposure, and the use of developers are not described in detail herein.

Similarly, generally known-etching processes can be employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed. As examples, poly-etch ($HF:HNO_3:CH_3COOH$) can generally be used for isotropic wet etching. Hydroxides of alkali metals (e.g., KOH), simple ammonium hydroxide ($NH_4OH$), quaternary (tetramethl) ammonium hydroxide (($CH_3)_4$ NOH, also known commercially as TMAH), and ethylenediamine mixed with pyrochatechol in water (EDP) can be used for anisotropic wet etching to fabricate V-shaped or tapered grooves, trenches or cavities. Silicon nitride is typically used as the masking material against etching by KOH, and thus can be used in conjunction with the selective etching of silicon. Silicon dioxide is slowly etched by KOH, and thus can be used as a masking layer if the etch time is short. While KOH will etch undoped silicon, heavily doped (p++) silicon can be used as an etch-stop against KOH as well as the alkaline etchants and EDP. A metal that can be used to form contacts and interconnects is gold, which is resistant to EDP. The adhesion layer applied in connection with forming a gold component (e.g., chromium) is also resistant to EDP.

It will be appreciated that electrochemical etching in hydroxide solution can be performed instead of timed wet etching. For example, if a p-type silicon wafer is used as a substrate, an etch-stop can be created by epitaxially growing an n-type silicon end layer to form a p-n junction diode. A voltage is applied between the n-type layer and an electrode disposed in the solution to reverse-bias the p-n junction. As a result, the bulk p-type silicon is etched through a mask down to the p-n junction, stopping at the n-type layer. Furthermore, photovoltaic and galvanic etch-stop techniques are also suitable.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide can be used as an etch-stop against DRIE, and thus structures containing a buried silicon dioxide layer, such as silicon-on-insulator (SOI) wafers, can be used as starting substrates for the fabrication of microstructures.

An alternative patterning process to etching is the lift-off process. In this case, the conventional photolithography techniques are used for the negative image of the desired pattern. This process can be used to pattern metals, which are deposited as a continuous film or films when adhesion layers and diffusion barriers are needed. The metal can be deposited on the regions where it is to be patterned and on top of the photoresist mask (negative image). The photoresist and metal on top can be removed to leave behind the desired pattern of metal, such as the patterning of contact lines.

Suitable electron field emitters, such as carbon nanotubes, can be formed on conductive or semiconductive surfaces, such as contact lines and cathodes, described herein by electrophoretic deposition techniques and any other suitable techniques known to those of skill in the art, such as screen printing, chemical vapor deposition, and spraying. Generally, for example, carbon nanotubes can be electrophoretically deposited on a surface by a combination of some or all of the following steps: (1) forming a solution or suspension containing the carbon nanotubes; (2) selectively adding "chargers" to the solution; (3) immersing electrodes in the solution, with the surface upon which the carbon nanotubes are to be deposited acting as one of the electrodes; (4) applying a direct and/or alternating current for creating an electrical field between the electrodes for a predetermined period of time to thereby cause the carbon nanotubes in the solution to migrate toward and attach themselves to the conductive or semiconductive surface; and (5) optional subsequent processing of the coated surface.

The components of multi-pixel electron microbeam irradiator systems described herein can be assembled by a variety of methods. Generally, for example, electron field emitters, a gate electrode, focusing electrodes, collimators, an anode having electron permeable portions, spacers and other components of a multi-pixel electron microbeam irradiator system can be positioned together as described herein to form a vacuum chamber. The electron field emitters can be positioned within the interior of the chamber along with other components, such as a gate electrode and anode, for generating electric fields for extracting electrons from the electron field emitters and accelerating the electrons through electron permeable portions of the anode. The vacuum chamber can be subsequently sealed and evacuated to a predetermined minimum pressure, or back-filled with an inert atmosphere, for preparation of generating electron beams.

According to one embodiment, an array of electron field emitters, a gate electrode, and a focusing electrode can be fabricated on a substrate by combination of electrophoresis and photolithography processes. Referring to FIGS. 3A–3F, a method for fabricating multiple electron field emitters, a gate electrode, and a focusing electrode according to one embodiment of the subject matter described herein is illustrated. Referring to FIG. 3A, a substrate 300 can be provided, which can be a 3" silicon wafer, glass, or other suitable substrate. A thermal oxide layer 302 can be disposed on a top surface of substrate 300. Further, electrically-isolated conductive contact lines 304 can be disposed on a top surface of layer 302. Contact lines 304 can be parallel electrode lines made of silver (Ag). Further, in one embodiment, contact lines 304 can be 150 µm in width and spaced by 100 µm.

Referring to FIG. 3B, electron field emitters FE can be deposited on a top surface of lines 304 by a photolithography/electrophoresis process. In one embodiment, a release/photoresist layer 306 can be deposited on portions of layer 302 that are not to be covered by electron field emitters FE. Further, in one embodiment, electron field emitters FE can be carbon nanotubes. Next, Referring to FIG. 3C, layer 306 can be removed without disturbing electron field emitters FE. An exemplary lithography and electrophoresis process for patterning carbon nanotubes is described in the publication "Liquid-Phase Fabrication of Patterned Carbon Nanotube Field Emission Cathodes," Oh et al., *Appl. Phys. Lett.*, 87(19): 3738 (2004), the disclosure of which is incorporated herein by reference in its entirety.

Referring to FIG. 3D, a dielectric insulation layer or spacer 308 comprising a plurality of apertures corresponding to electron field emitters FE can be disposed on the top surface of layer 302 between electron field emitters FE. Insulation layer 308 can be aligned using a mask aligner. In one embodiment, insulation layer 308 can be made of glass or any other suitable insulation material. Insulation layer 308 can be about 15 µm in thickness and patterned with an opening for exposing contact lines 304.

Referring to FIG. 3E, a gate electrode GE comprising a plurality of apertures corresponding to electron field emitters FE can be disposed on insulation layer 308. Next, referring to FIG. 3F, another insulation layer 310 and a focusing electrode FEL can be disposed on gate electrode GE. Insulation layer 310 and focusing electrode FEL can include a plurality of apertures corresponding to electron field emitters FE. An anode including a plurality of electron transparent windows can be fabricated. Each of the windows can correspond to one of electron field emitters FE. Alignment can be accomplished using alignment marks under a mask aligner and bonded together using a suitable wafer bonding technique.

According to one embodiment, electron field emitters FE can be about 50–100 µm in diameter. Further, electron field emitters FE can be electrically insulated from one another so that they can be individually addressed or controlled. Spacing between gate electrode GE and electron field emitters FE can be about 100 µm or any suitable distance such that a desired current can be reached with 1–2 kV driving voltage on gate electrode GE. Focusing electrode FEL can focus the field-emitted electrons on the electron transparent windows of the anode.

In an alternate embodiment, insulation layer or spacer 308 and gate electrode GE can be deposited on the top surface of layer 302 prior to the deposition of electron field emitters FE. Next, insulation layer 308 and gate electrode GE can be covered by layers of resist and release materials. For example, contact lines 304, insulation layer 308, and gate electrode GE can be spin-coated with a uniform layer of OMNICOAT™ release (available from MicroChem, Inc. of Newton, Me.). Next, contact lines 304, insulation layer 308, and gate electrode GE can be spin-coated with a uniform layer of epoxy-based SU-8 negative photoresist product (available from MicroChem, Inc.) of about 10–20 mm in thickness. Depending on the desired SU-8 thickness, spin speed and viscosity of SU-8 can be controlled. The photoresist can be insoluble in alcohol. Next, the photoresist can be patterned by contact-mode UV photolithography and developed such that the area contact lines 304 to be deposited with electron field emitters FE is removed while the other surfaces are covered with cross-linked SU-8. Subsequently, the exposed OMNICOAT™ release can be chemically removed to reveal contact lines 304. Next, electron field emitters FE (in this example, carbon nanotubes) can be electrophoretically deposited onto contact lines 304 by applying a DC voltage between contact lines 304 and a counter-electrode submerged in alcohol containing carbon nanotubes. Further, $MgCl_2$ "chargers" can be added to the solution and a voltage applied between contact lines 304 and counter-electrode to cause the carbon nanotubes to deposit on contact lines 304. After deposition of the carbon nanotubes, the photoresist can be stripped using a release such as an OMNICOAT™ release.

Figure 4A:
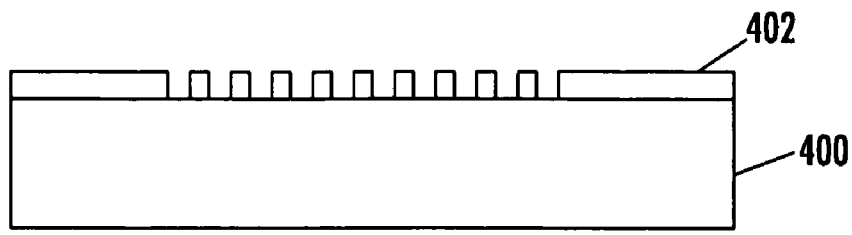
FIGS. 4A–4E are steps of a method for fabricating a gate electrode according to one embodiment of the subject matter described herein.
Figure 4B:
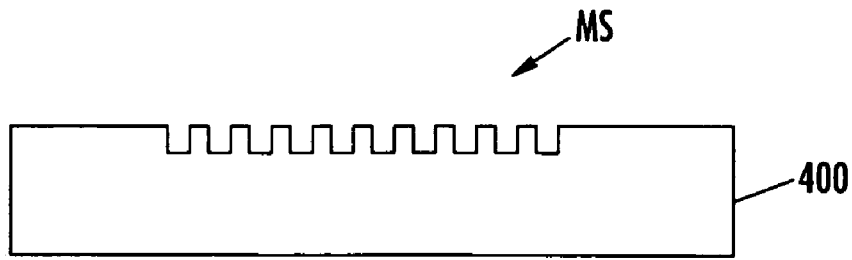
Figure 4C:
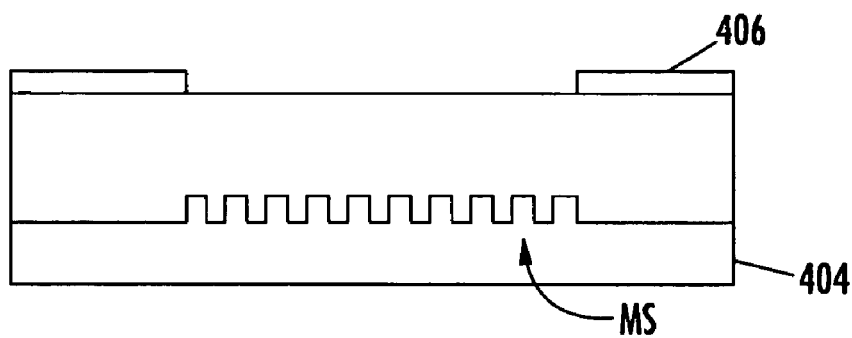
Figure 4D:
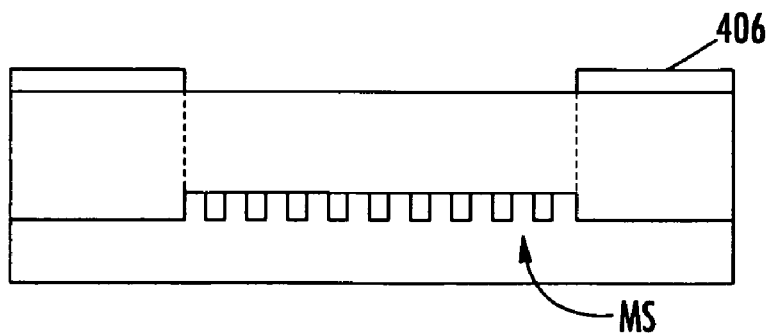
Figure 4E:
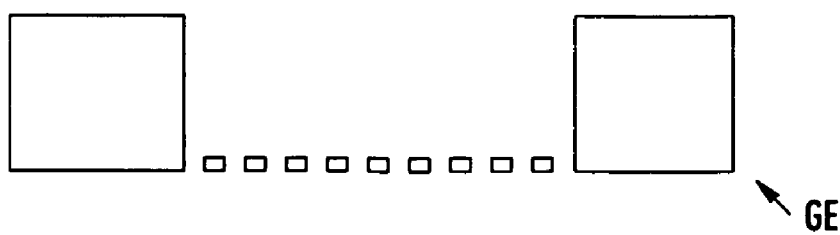

According to one embodiment, a gate electrode can be fabricated by combination of photolithography and deep reactive ion etch (DRIE) processes. Referring to FIGS. 4A–4E, a method for fabricating a gate electrode according to one embodiment of the subject matter described herein is illustrated. Referring to FIG. 4A, a substrate 400 can be provided, which can be a silicon wafer or other suitable substrate. Next, substrate 400 can patterned with an etch mask 402 for forming a metal mesh structure. Referring to FIG. 4B, a mesh structure MS can be formed by performing a deep reactive ion etch. The etch can be about 50 μm deep. Referring to FIG. 4C, mesh structure MS can be covered with a photoresist 404 and an opposing side of substrate 400 covered with an etch mask 406. Next, referring to FIG. 4D, a deep reactive ion etch can be performed from the opposing side until an aperture is formed to mesh structure MS. Referring to 4E, photoresist 404 and etch mask 406 can be removed for completing the fabrication of gate electrode GE.

Figure 5A:
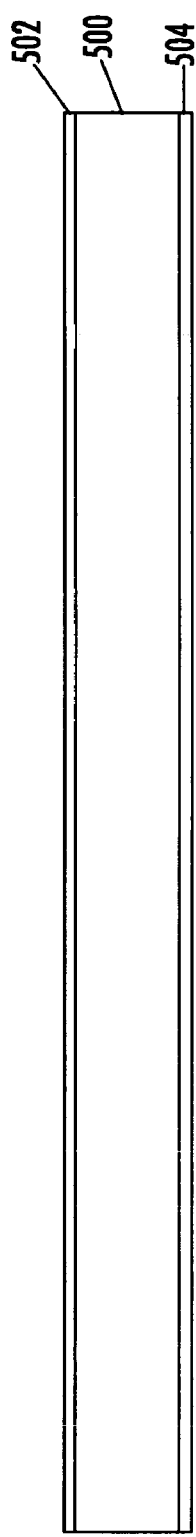
FIGS. 5A–5D are steps of a method for fabricating an anode including a plurality of electron transparent windows according to one embodiment of the subject matter described herein.

According to one embodiment, an anode including a plurality of electron transparent windows can be fabricated by combination of lithography, anisotropic silicon etching, and DRIE processes. Referring to FIGS. 5A–5D, a method for fabricating an anode including a plurality of electron transparent windows according to one embodiment of the subject matter described herein is illustrated. Referring to FIG. 5A, a substrate 500 can be provided, which can be a silicon wafer, ITO-coated glass, or other suitable substrate. Electron permeable layers 502 and 504 can be deposited on opposing sides of substrate 500. Layers 502 can be made of silicon nitride ($Si_3N_4$) or any other suitable material that is permeable to electrons. Silicon nitride has a high permeability to electrons and is mechanically robust for supporting a pressure differential of at least one atmosphere. In one embodiment, layer 502 may be a layer of silicon nitride having a thickness between about 500–1000A, which can function as an etch mask for an etching process. Layer 504 can be a 2500A layer of silicon nitride, a portion of which can function as electron transparent windows.

Figure 5B:
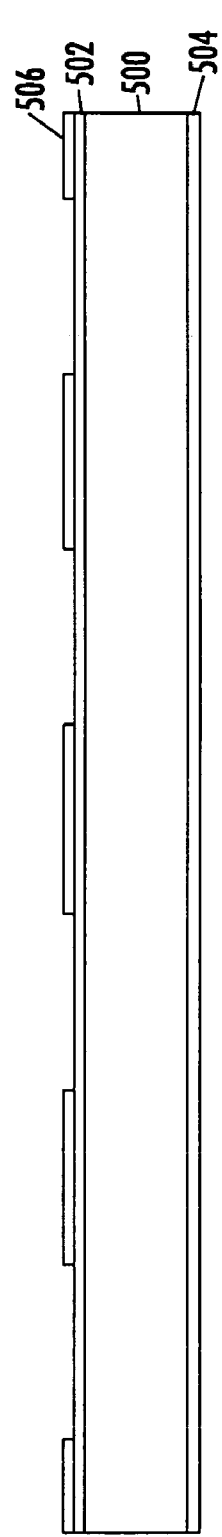
Figure 5C:
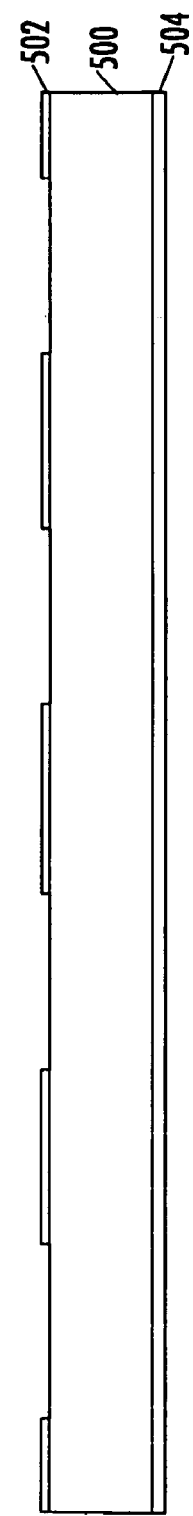
Figure 5D:
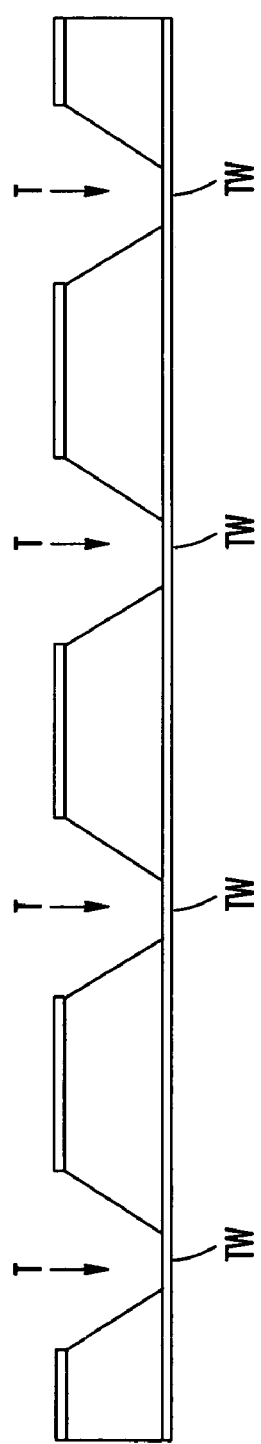

Referring to FIG. 5B, areas on layer 502 can be defined for etching. For example, layer 502 can be patterned with a photoresist 506. Referring to FIG. 5C, a reactive ion etching process can be applied to remove the portions of layer 502 left uncovered by photoresist 506. Next, photoresist 506 can be removed. Referring to FIG. 5D, exposed portions of substrate 500 are removed by an anisotropic hot KOH etch. Trenches T can be formed by etching through substrate 500 to form electron transparent windows TW. In one example, transparent windows TW can be about 20 μm×20 μm. Transparent windows TW can be positioned for intercepting electron beams emitted from electron field emitters (such as electron field emitters FE shown in FIGS. 1 and 2). Alignment marks can be patterned on the wafer to assist subsequent assembly with the electron field emitters. The resulting structure can function as a collimator of the electron beams when substrate 500 is of a material and thickness for preventing the penetration of electrons therethrough. For example, a silicon wafer having a thickness of 400 μm can prevent electrons from penetrating through.

In one embodiment, the nitride can be unaffected by the etch process. After completion of the KOH anisotropic etching, a metal layer can be deposited onto the resulting wafer. The metal can be deposited onto the areas of the wafer not covered by a photoresist. The photoresist can be lifted off in a solvent. The metal layer can serve as an anode component in a multi-pixel electron microbeam irradiator system according to one embodiment of the subject matter described herein.

Figure 6:
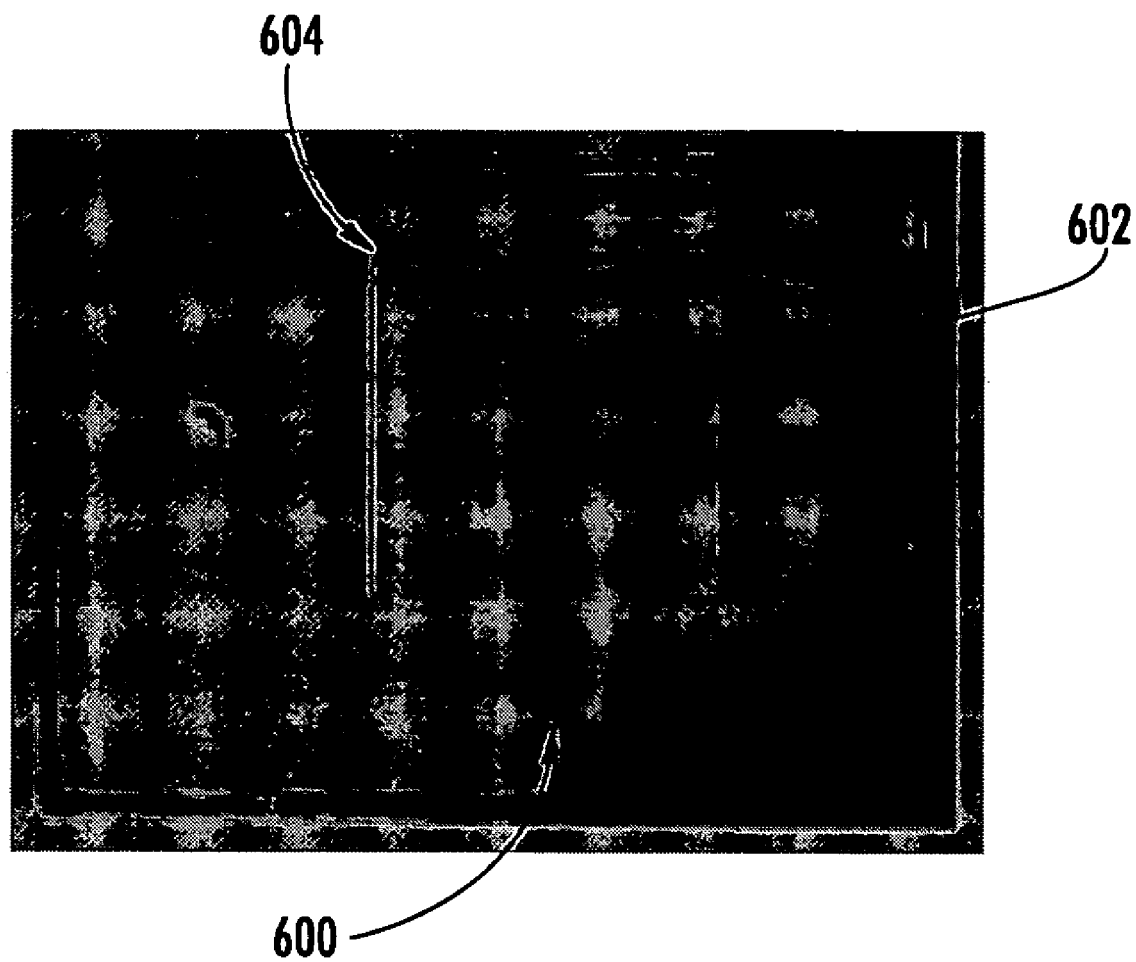
FIG. 6 is an optical image of an individually addressable electron field emitter structure.
Figure 7:
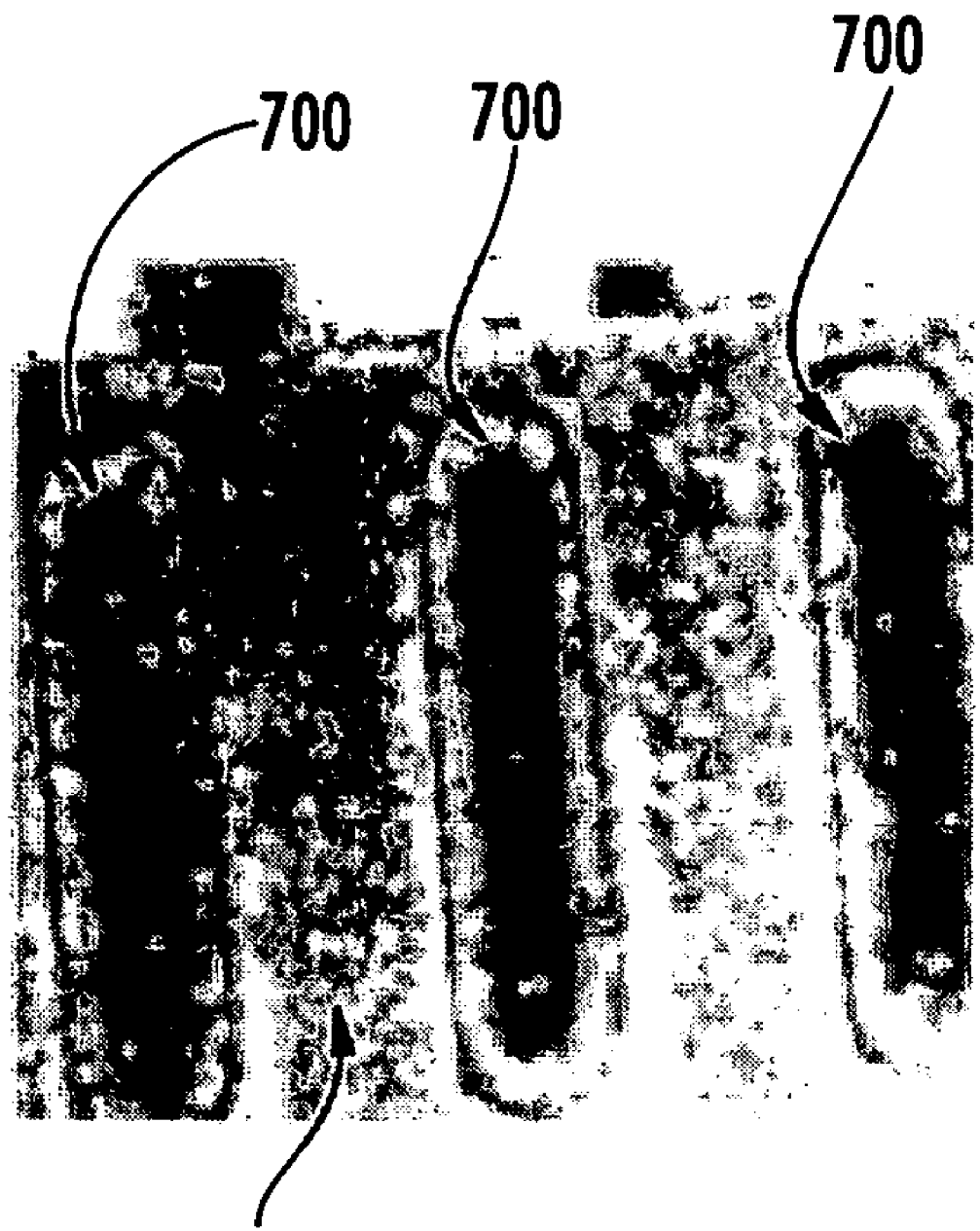
FIG. 7 is an optical image of a top view of three electron field emitters after carbon nanotube deposition and removal of a photoresist.

FIGS. 6 and 7 are representations of optical images of actual electron field emitter structures. In particular, FIG. 6 is an optical image of an individually addressable electron field emitter structure. The image shows a cathode electrode 600, a gate electrode 602, and an active area 604.

FIG. 7 is an optical image of a top view of three electron field emitters after carbon nanotube deposition (dark areas) and removal of a photoresist. The image shows carbon nanotubes 700 on cathode lines and a gate electrode 702.

A multi-pixel electron microbeam irradiator system according to the subject matter described herein can be used for individually irradiating a selected single cell or a sub-cellular region in a cell population in vitro, without depositing radiation doses to adjacent cells and regions. Further, multi-pixel electron microbeam cell irradiator systems according to the subject matter described herein can be used by researchers for studying microscopic processes activated by particular cellular or sub-cellular components of interest following radiation.

The above-described components and techniques can be applied to devices and systems having electron field emitters and related methods. In addition to uses described above, exemplary devices and systems that can be used with the subject matter described herein can include flat-panel displays, microwave vacuum tubes, portable X-ray devices, and gas discharge tubes.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

What is claimed is:

1. A method for selectively irradiating target biological cells, the method comprising:
    (a) providing a plurality of individually controllable electron field emitters;
    (b) providing an electrode operable to extract electrons from the electron field emitters;
    (c) determining target biological cells for irradiation;
    (d) identifying locations of the determined target biological cells; and
    (e) individually controlling electron extraction from each of the electron field emitters to selectively irradiate the identified locations for irradiating the determined target biological cells.

2. The method of claim 1 wherein the electron field emitters comprise components selected from the group consisting of a nanotube, a nanorod, a Spindt tip, and nanoparticles of diamond.

3. The method of claim 1 wherein the electron field emitters comprise carbon nanotubes.

4. The method of claim 1 wherein individually controlling electron extraction includes individually controlling a supply of voltages between each of the electron field emitters and the electrode.

5. The method of claim 1 comprising focusing the electrons emitted from the electron field emitters into a plurality of focused electron beams for irradiating the identified locations.

6. The method of claim 1 comprising:
  (a) providing an anode comprising a plurality of electron permeable portions corresponding to the plurality of electron field emitters; and
  (b) applying a voltage between the electron permeable portions and the electrode for accelerating the extracted electrons through the electron permeable portions.

7. The method of claim 1 comprising determining relative coordinates of locations that can be irradiated by the electron field emitters.

8. The method of claim 7 comprising matching at least one of the identified locations of the determined target biological cells with at least one of the relative coordinates.

9. The method of claim 8 wherein individually controlling electron extraction comprises controlling electron extraction from the electron field emitters corresponding to the at least one of the identified relative coordinates matched to the at least one of the identified locations of the determined target biological cells.

10. A method for selectively irradiating predetermined locations on biological cells, the method comprising:
  (a) providing a plurality of individually addressable electron field emitters;
  (b) providing an electrode operable to extract electrons from the electron field emitters;
  (c) providing an anode comprising one or more electron permeable portions corresponding to the plurality of electron field emitters; and
  (d) individually controlling electron extraction from each of the electron field emitters to selectively irradiate a plurality of predetermined locations on biological cells through the one or more electron permeable portions.

11. A method for manufacturing a multi-pixel electron microbeam biological cell irradiator system, the method comprising:
  (a) depositing a plurality of conductive contacts on a substrate, wherein the conductive contacts are spaced apart and electrically isolated from one another;
  (b) depositing a plurality of electron field emitters on the conductive contacts;
  (c) depositing a non-conductive spacer on the substrate;
  (d) depositing an electrode on the non-conductive spacer; and
  (e) providing a plurality of transistors operable to be individually controlled to apply different voltages between the conductive contacts and the electrode for individually extracting electrons from each of the electron field emitters for selectively irradiating a plurality of predetermined locations on biological cells.

12. The method of claim 11 wherein the conductive contacts comprise conductive lines.

13. The method of claim 11 wherein the substrate comprises material selected from the group consisting of silicon and glass.

14. A method for selectively irradiating target cells, the method comprising:
  (a) providing a plurality of individually controllable electron field emitters;
  (b) providing an electrode operable to extract electrons from the electron field emitters;
  (c) determining target cells for irradiation;
  (d) identifying locations of the determined target cells;
  (e) individually controlling electron extraction from each of the electron field emitters to selectively irradiate the identified locations for irradiating the determined target cells;
  (f) depositing a second non-conductive spacer on the electrode;
  (g) depositing a focusing electrode on the second non-conductive spacer;
  (h) depositing a third non-conductive spacer on the focusing electrode; and
  (i) depositing a collimator on the third non-conductive spacer.

15. The method of claim 14 comprising:
  (a) depositing a fourth non-conductive spacer on the focusing electrode; and
  (b) providing an anode on the third non-conductive spacer, wherein the anode includes at least one electron permeable portion.

16. A method for selectively irradiating target cells, the method comprising:
  (a) depositing a plurality of conductive contacts on a substrate, wherein the conductive contacts are spaced apart and electrically isolated from one another;
  (b) depositing a plurality of electron field emitters on the conductive contacts;
  (c) depositing a non-conductive spacer on the substrate;
  (d) depositing an electrode on the non-conductive spacer; and
  (e) providing a plurality of transistors operable to be individually controlled to apply different voltages between the conductive contacts and the electrode for individually extracting electrons from each of the electron field emitters for selectively irradiating predetermined locations; and
  (f) providing an anode on the substrate, wherein providing an anode comprises:
    (i) providing a substrate including an electron permeable layer on a surface thereof; and
    (ii) etching through the substrate to the electron permeable layer from a surface opposing the electron permeable layer.

17. A method for selectively irradiating target biological cells, the method comprising:
  (a) identifying a plurality of target locations on biological cells;
  (b) determining dosage to be used for each target location; and
  (c) programming a controller of a multi-pixel electron microbeam cell irradiator system to set an amplitude and duration of a gate voltage to be applied to electron field emitters on one or more cathodes such that each electron field emitter provides a predetermined amount of electrons to corresponding target locations.

18. A multi-pixel array microbeam irradiator for ex-vivo cellular irradiation of a biological sample, the microbeam irradiator comprising:

(a) an array of individually addressable electron microbeam pixels; and
(b) a controller operable to individually control electron microbeam emission from each of the electron microbeam emitters for selectively irradiating a biological sample at predetermined microscopic locations with respective microbeams at controlled radiation doses and dose rates.

19. The microbeam irradiator of claim 18 wherein the biological sample comprises a plurality of biological cells contained in a Petri dish, wherein specific cells of the biological cells are selected under a microscope, wherein the controller of the microbeam irradiator is configured to individually control the microbeam pixels to irradiate the selected cells with the microbeams, and wherein the controller of the microbeam irradiator is configured to control the microbeam pixels to irradiate corresponding selected cells by a respective microbeam with controlled dose and dose rate.

20. The microbeam irradiator of claim 18 wherein the biological sample comprises a plurality of biological cells, wherein the microbeam irradiator comprises an optical imaging device configured to image the biological cells before, during, and after cell irradiation for investigation of cellular and subcellular responses to high spatial and temporal resolution irradiation.

21. The microbeam irradiator of claim 18 comprising an electron-transparent window configured to vacuum-seal the microbeam irradiator and configured to allow the microbeams escape through the window to the ambient to irradiate the biological sample.

22. The microbeam irradiator of claim 21 wherein the biological sample is positioned outside the electron-transparent window in the ambient for receiving the microbeams.

23. The microbeam irradiator of claim 18 comprising a multi-pixel microbeam collimator configured to define the cross-sectional area of each microbeam.

24. The microbeam irradiator of claim 18 wherein the diameter of each microbeam escaping from the electron-transparent window is on the order of 1–100 microns.

25. The microbeam irradiator of claim 18 wherein the array of individually addressable electron microbeam pixels comprises:
(i) a two-dimensional cathode array with a plurality of individually addressable electron field emitters; and
(ii) an anode comprising one or more electron permeable portions corresponding to the plurality of electron field emitters; and
wherein the controller is operable to individually control electron extraction from each of the electron field emitters for selectively irradiating predetermined cells or cell locations of the biological sample.

26. The microbeam irradiator of claim 25 wherein the anode is coupled to ground and the cathode is operated at a high voltage.

27. The microbeam irradiator of claim 25 comprising an electron transparent window comprising silicon nitride.

28. The microbeam irradiator of claim 25 wherein the electron field emitters comprise carbon nanotubes.

29. The microbeam irradiator of claim 25 wherein the electron field emitters comprise components selected from the group consisting of a nanotube, a carbon nanotube, a nanorod, a Spindt tip, and nanoparticles of diamond.

30. The microbeam irradiator of claim 25 comprising a gate electrode including a plurality of apertures through which electrons travel.

31. The microbeam irradiator of claim 25 comprising a focusing electrode configured to focus the electrons emitted from the electron field emitters into a plurality of focused electron beams for irradiating the predetermined microscopic locations.

32. The microbeam irradiator of claim 25 wherein a cross section of one of the electron beams is less than about 20 microns in diameter.

33. The microbeam irradiator of claim 25 wherein energy of the electrons irradiating the predetermined microscopic locations is greater than about 10 KeV.

34. The microbeam irradiator of claim 25 comprising:
(a) an electrode; and
(b) a power source operable to apply a voltage between the electron permeable portions and the electrode for accelerating electrons through the electron permeable portions.

35. The microbeam irradiator of claim 25 wherein the one or more electron permeable portions comprise a thin layer of nitride.

36. The microbeam irradiator of claim 25 wherein the one or more electron permeable portions comprise a thin layer of boride.

37. The microbeam irradiator of claim 25 wherein the one or more electron permeable portions comprise a thin layer of polymer.

38. A method for ex-vivo cellular irradiation of a biological sample, the microbeam irradiator comprising:
(a) providing an array of individually addressable electron microbeam pixels; and
(b) individually controlling electron microbeam emission from each of the electron microbeam emitters to selectively irradiate a biological sample at predetermined microscopic locations with respective microbeams at controlled radiation doses and dose rates.

39. The method of claim 38 wherein the biological sample comprises a plurality of biological cells contained in a Petri dish, and the method comprises:
(a) selecting specific cells of the biological cells under a microscope;
(b) individually controlling the microbeam pixels to irradiate the selected cells with the microbeams; and
(c) controlling the microbeam pixels to irradiate corresponding selected cells by a respective microbeam with controlled dose and dose rate.

40. The method of claim 38 wherein the biological sample comprises a plurality of biological cells, and the method comprises imaging the biological cells with an optical imaging device before, during, and after cell irradiation for investigation of cellular and subcellular responses to high spatial and temporal resolution irradiation.

41. The method of claim 38 comprising providing an electron-transparent window configured to vacuum-seal the microbeam irradiator and configured to allow the microbeams escape through the window to the ambient to irradiate the biological sample.

42. The method of claim 41 comprising positioning the biological sample outside the electron-transparent window in the ambient for receiving the microbeams.

43. The method of claim 38 comprising providing a multi-pixel microbeam collimator configured to define the cross-sectional area of each microbeam.

44. The method of claim 38 wherein the diameter of each microbeam escaping from the electron-transparent window is on the order of 1–100 microns.

45. The method of claim 38 wherein providing an array of individually addressable electron microbeam pixels includes providing:
  (i) a two-dimensional cathode array with a plurality of individually addressable electron field emitters; and
  (ii) an anode comprising one or more electron permeable portions corresponding to the plurality of electron field emitters; and
  wherein the method comprises individually controlling electron extraction from each of the electron field emitters to selectively irradiate predetermined cells or cell locations of the biological sample.

46. The method of claim 45 wherein the anode is coupled to ground and the cathode is operated at a high voltage.

47. The method of claim 45 comprising providing an electron transparent window comprising silicon nitride.

48. The method of claim 45 wherein the electron field emitters comprise carbon nanotubes.

49. The method of claim 45 wherein the electron field emitters comprise components selected from the group consisting of a nanotube, a carbon nanotube, a nanorod, a Spindt tip, and nanoparticles of diamond.

50. The method of claim 45 comprising providing a gate electrode including a plurality of apertures through which electrons travel.

51. The method of claim 45 comprising providing a focusing electrode configured to focus the electrons emitted from the electron field emitters into a plurality of focused electron beams for irradiating the predetermined microscopic locations.

52. The method of claim 45 wherein a cross section of one of the electron beams is less than about 20 microns in diameter.

53. The method of claim 45 wherein energy of the electrons irradiating the predetermined microscopic locations is greater than about 10 KeV.

54. The method of claim 45 comprising:
  (a) providing an electrode; and
  (b) providing a power source operable to apply a voltage between the electron permeable portions and the electrode for accelerating electrons through the electron permeable portions.

55. The method of claim 45 wherein the one or more electron permeable portions comprise a thin layer of nitride.

56. The method of claim 45 wherein the one or more electron permeable portions comprise a thin layer of boride.

57. The method of claim 45 wherein the one or more electron permeable portions comprise a thin layer of polymer.

* * * * *